US010921386B2

(12) United States Patent
Pabbathi et al.

(10) Patent No.: US 10,921,386 B2
(45) Date of Patent: Feb. 16, 2021

(54) METHODS AND DEVICES FOR CALCULATING WINDING CURRENTS AT A DELTA SIDE FOR A TRANSFORMER

(71) Applicant: ABB Power Grids Switzerland AG, Baden (CH)

(72) Inventors: Sandeep Pabbathi, Bangalore (IN); Prabakaran S, Bangalore (IN); Suresh Maturu, Cherukupalli (IN)

(73) Assignee: ABB Power Grids Switzerland AG, Baden (CH)

( * ) Notice: Subject to any disclaimer, the term of this patent is extended or adjusted under 35 U.S.C. 154(b) by 69 days.

(21) Appl. No.: 16/447,933

(22) Filed: Jun. 20, 2019

(65) Prior Publication Data
US 2019/0391199 A1 Dec. 26, 2019

(30) Foreign Application Priority Data

Jun. 21, 2018 (IN) .............................. 201841023197
Aug. 9, 2018 (EP) .................................... 18188292

(51) Int. Cl.
*G01R 31/72* (2020.01)
*G01R 31/62* (2020.01)
(Continued)

(52) U.S. Cl.
CPC ............. *G01R 31/72* (2020.01); *G01R 31/62* (2020.01); *H01F 27/28* (2013.01); *H02H 7/045* (2013.01)

(58) Field of Classification Search
CPC ........ G01R 31/00; G01R 31/50; G01R 31/62; G01R 31/72; G01R 19/00; G01R 19/0084;
(Continued)

(56) References Cited

U.S. PATENT DOCUMENTS 4,837,671 A * 6/1989 Wild ................... H02M 7/7575
363/35
6,274,851 B1 * 8/2001 Mulcahy ................ H05B 7/148
219/501
(Continued)

FOREIGN PATENT DOCUMENTS

CN 101105517 A 1/2008
CN 104049174 A 9/2014
(Continued)

OTHER PUBLICATIONS

Beckwith Electric Co., Inc., "M-3311A Transformer Protection Relay", Instruction Book 1 of 2, 2007, 189 pages.
(Continued)

*Primary Examiner* — Hoai-An D. Nguyen
(74) *Attorney, Agent, or Firm* — Slater Matsil, LLP

(57) ABSTRACT

The present disclosure relates to methods and devices for calculating winding currents at a delta side for a transformer. The transformer has two or more windings, with a first winding being a delta connected winding. The method includes obtaining line currents measured with measurement equipment associated with lines connected with the windings. The method further includes calculating zero sequence currents for at least a second winding, from the line currents of a corresponding line. The method further includes calculating zero sequence currents for the first winding, based on the zero sequence currents for at least the second winding, a phase displacement between the windings, and a turns ratio associated with the windings. The winding currents is calculated from the zero sequence currents of the first winding, and the line currents of a corresponding line.

15 Claims, 7 Drawing Sheets

(51) Int. Cl.
*H01F 27/28* (2006.01)
*H02H 7/045* (2006.01)

(58) Field of Classification Search
CPC ........ G01R 19/0092; H02H 7/00; H02H 7/04; H02H 7/045; H01F 27/00; H01F 27/28; H01F 27/2804; H01F 27/2819; H01F 27/2876
USPC ....... 324/600, 649, 691, 713, 726, 500, 537, 324/546, 547, 76.11, 107, 108, 126, 127, 324/131
See application file for complete search history.

(56) References Cited

U.S. PATENT DOCUMENTS

| | | | |
|---|---|---|---|
| 7,940,054 B2 | 5/2011 | Labuschagne et al. | |
| 9,671,440 B2 | 6/2017 | Park et al. | |
| 2008/0067960 A1* | 3/2008 | Maeda | B62D 5/046 318/400.02 |
| 2011/0063761 A1* | 3/2011 | Kasztenny | H02H 7/045 361/36 |
| 2018/0131173 A1* | 5/2018 | Iwami | H02H 3/332 |
| 2019/0227108 A1* | 7/2019 | Iwanusiw | G01R 29/20 |

FOREIGN PATENT DOCUMENTS

| | | |
|---|---|---|
| CN | 104078933 A | 10/2014 |
| KR | 20060111820 A | 10/2001 |

OTHER PUBLICATIONS

IEEE Guide for Liquid-Immersed Transformer Through-Fault-Current Duration, IEEE Std C57.109-1993 (R2008), Reaffirmed by IEEE Standards Board, Mar. 27, 2008, 16 pages.

IEEE Standard General Requirements for Liquid-Immersed Distribution, Power, and Regulating Transformers, IEEE Std C57.12.00-2000, Approved by IEEE-SA Standards Board, Jun. 21, 2000, 62 pages.

International Electrotechnical Commission (IEC), "International Standard", IEC 60076-1, Edition 2.1, Apr. 2000, 50 pages.

Schweitzer Engineering Laboratories, Inc., SEL-2414 Transformer Monitor, Instruction Manual, Jan. 26, 2016, 386 pages.

Zheng, Tao, et al., "A Novel Algorithm of Calculating the Circulating Current on the Delta Side of Three Phase Wye-Delta Connected Transformer", IEEE T&D Asia 2009, 4 pages.

* cited by examiner

METHODS AND DEVICES FOR CALCULATING WINDING CURRENTS AT A DELTA SIDE FOR A TRANSFORMER

CROSS-REFERENCE TO RELATED APPLICATIONS

This application claims priority under 35 U.S.C. § 119 to European Patent Application No. 18188292.9, filed Aug. 9, 2018, and to Indian Patent Application No. 201841023197, filed Jun. 21, 2018, the entire disclosures of which are each incorporated by reference herein.

TECHNICAL FIELD

The present disclosure relates to power transformers. More specifically, the present disclosure relates to calculating winding currents at delta side for transformers.

BACKGROUND

Winding currents are required for transformer monitoring, protection and control. For example, to estimate a degradation in a transformer capability to withstand through faults, winding currents and line currents are required. Winding currents are not readily measurable in the case of delta connected windings. This is because of circulating currents (zero sequence currents) at the delta side.

There are some prior art methods that relate to finding the winding currents at the delta side. In one prior art method, Current Transformers (CTs) are provided in the delta connected windings, and the CT measurements in the windings indicate the winding currents. This method does not require any calculation of winding currents. However, the transformer be designed with the CTs already provided within the windings to have the measurements. There is another prior art method for calculating the circulating currents from voltage and current measurements. This method utilizes voltage equations of a transformer for determining winding parameters (e.g. resistance, inductance etc.). This method requires additional measurements (i.e. with voltage transformers (PTs)), which may not always be available.

It is desirable to calculate winding currents from line currents. This is because the measurements which are typically available at the delta side are the line currents. The winding currents cannot be correctly calculated from the measured line currents. This is because the line currents will not have measurements corresponding to the circulating currents in the delta connected windings.

Consider a case where there are ground faults. Here, a neutral phase of the winding at the other side (i.e. winding other than delta connected) may be earthed. In such a case, the zero sequence currents at the delta side are not replicated in the measurements of the line currents. Accordingly, any calculations and applications (e.g. energy estimations of delta windings) are likely to give optimistic results as zero sequence currents are not considered.

Accordingly, there is need for improvements in calculating winding currents for delta connected windings.

SUMMARY

One aspect of the present disclosure relates to a method for calculating winding currents at a delta side for a transformer. The transformer can have two or more windings. In an embodiment, the transformer has two windings. In another embodiment, the transformer has three windings.

The two or more windings are connected with two or more lines. In accordance with different embodiments, the transformer has at least one winding (e.g. first winding), which is a delta connected winding (i.e. windings connected in a delta configuration). In the embodiment where the transformer has two windings, a second winding of the transformer may be a star connected or a wye connected winding (i.e. having a star or wye configuration). Note that a star connected winding may be referred as a wye connected winding. In the embodiment where the transformer has three windings, each of the other two windings may be a star connected or a wye connected winding.

The method comprises obtaining line currents measured with measurement equipment associated with the two or more lines (transmission lines). For example, there can be Current Transformers (CTs) associated with each line. The CTs can measure line currents of the corresponding lines (e.g. CTs can be for each phase measuring line currents in each phase). Thus, for each winding, the line currents towards the winding, measured by the corresponding measurement equipment are available.

The method further comprises calculating zero sequence currents for at least a second winding of the two or more windings of the transformer. The zero sequence currents for at least the second winding are calculated from the line currents measured at a corresponding line connected with at least the second winding. Here, it is assumed that the second winding (or the second and third winding) may be earthed (for example in case of star/wye connected windings with neutral earthed).

In the embodiment, wherein the transformer has two windings, the zero sequence currents are calculated for the second winding, based on the line currents measured for the line connected with the second winding. In the embodiment, wherein the transformer has three windings, the zero sequence currents are calculated for the second and third windings, based on the line currents measured for the lines connected with the second and third windings respectively.

In addition, the method comprises calculating zero sequence currents for the first winding (i.e. the delta connected winding). The zero sequence currents for the first winding are calculated based on the zero sequence currents calculated for at least the second winding (i.e. second winding, or second and third windings), a phase displacement between the two or more windings, and a turns ratio associated with the two or more windings of the transformer.

In the embodiment wherein the transformer has two windings (i.e. the first and second windings), the zero sequence currents for the first winding are calculated from:
the zero sequence currents calculated for the second winding,
the phase displacement between the first and second windings, and
the turns ratio between the first and second windings.

In the embodiment wherein the transformer has three windings (i.e. the first, second and third windings), the zero sequence currents for the first winding are calculated from:
the zero sequence currents calculated for the second and third windings,
the phase displacement between the first and second windings,
the phase displacement between the first and third windings,
the turns ratio between the first and second windings, and
the turns ratio between the first and third windings.

In the above, the turns ratio between two windings can be a voltage ratio between the two windings (i.e. first and second windings, or first and third windings).

The method further comprises calculating winding currents for the first winding (i.e. the delta connected winding). The winding currents for the delta connected winding are calculated from the zero sequence currents calculated for the first winding, and the line currents measured at a corresponding line connected with the first winding.

In addition, the method comprises rendering the winding currents values for one or more of monitoring, protection and control operations associated with the transformer. For example, the winding current values may be used for a transformer monitoring operation, or for a transformer protection operation (or both). The rendering can include generating a signal for displaying the winding current values on an interface, or generating a signal for operating equipment associated with the transformer etc.

In an embodiment, the monitoring, protection and control operation comprises displaying the winding current values on an interface. The interface may be the interface of a device associated with the transformer. In another embodiment, the monitoring, protection and control operation comprises generating a trip signal based on the winding current values. In yet another embodiment, the monitoring, protection and control operation comprises calculating a health index associated with the first winding based on the winding current values. The health index can be related with degradation of the winding, remaining life of the winding, finding temperature hotspots in the winding etc.

The method can be performed with a device associated with the transformer. For example, the device can be an intelligent electronic device (IED) for calculating the winding currents at the delta side for the transformer.

The device has an input interface, a current calculator and an output interface. The input interface obtains the line currents measured with the measurement equipment associated with the two or more lines. The current calculator calculates the zero sequence currents for at least the second winding, the zero sequence currents for the first winding, and the winding currents for the first winding. The output interface renders the winding currents values for one or more of monitoring, protection and control operations associated with the transformer.

In an embodiment, the output interface comprises a display. In accordance with the embodiment, the rendering comprises generating a signal to display the winding current values on the display of the device.

In an embodiment, the device is connected with a switching device. Here, the switching device can be a circuit breaker. In accordance with the embodiment, the device performs a protection function. Here, the rendering comprises generating a trip signal for operating the switching device associated with the transformer.

BRIEF DESCRIPTION OF DRAWINGS

The present disclosure will be explained in more detail in the following text with reference to exemplary embodiments which are illustrated in attached drawings in which.

DETAILED DESCRIPTION

Various embodiments of the present disclosure relate to calculating winding currents for a power transformer. The power transformer can have two or more windings. In accordance with various embodiments, at least one winding of the transformer is a delta connected winding (i.e. a winding connected in a delta configuration). For example, the transformer has two windings with delta configurations, or one winding with delta configuration and one winding with star or wye configuration, or one winding with delta configuration and two windings with star or wye configurations etc.

Figure 1:
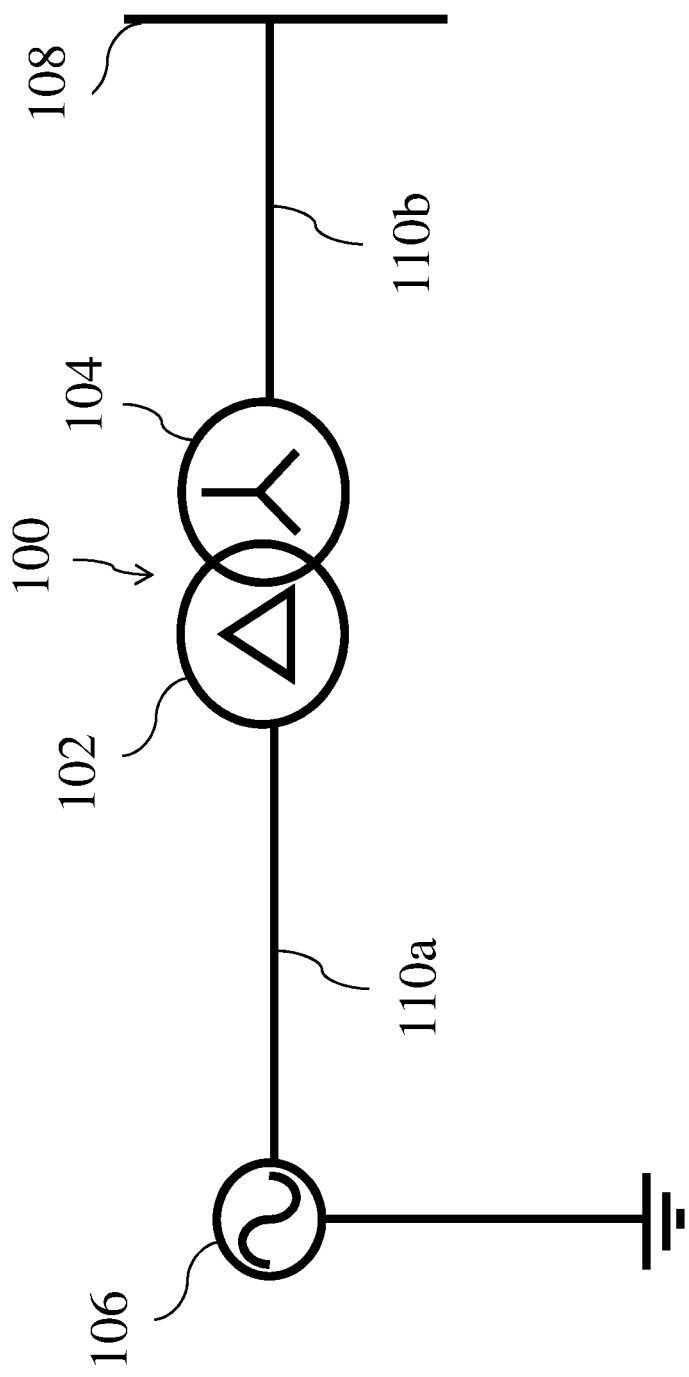
FIG. 1 shows a single line diagram of a power transformer connected in a power system, in accordance with one embodiment.

FIG. 1 shows a single line diagram of a power transformer connected in a power system, in accordance with one embodiment of present disclosure. As shown in FIG. 1, the power transformer (100) has two windings. Here, a first winding (102) is a delta connected winding. In accordance with different embodiments, the transformer has at least a second winding. In the embodiment of FIG. 1, the transformer has one second winding (104), which is a star connected winding. In the embodiment of FIG. 1, the delta connected winding may be the primary winding of the transformer. Alternately, the star connected winding may be the primary winding. Here, it is assumed that the second winding (or the second and third winding) may be earthed (for example in case of star/wye connected windings with neutral earthed).

The two or more windings can be connected with two or more lines. In the embodiment illustrated in FIG. 1, the power transformer connects a source (106) with a terminal (or bus 108). Here, the first winding is connected with a first line (110*a*), and the second winding is connected with a second line (110*b*). Each line can be an AC line. For example, the lines can be three phase AC lines.

Figure 2:
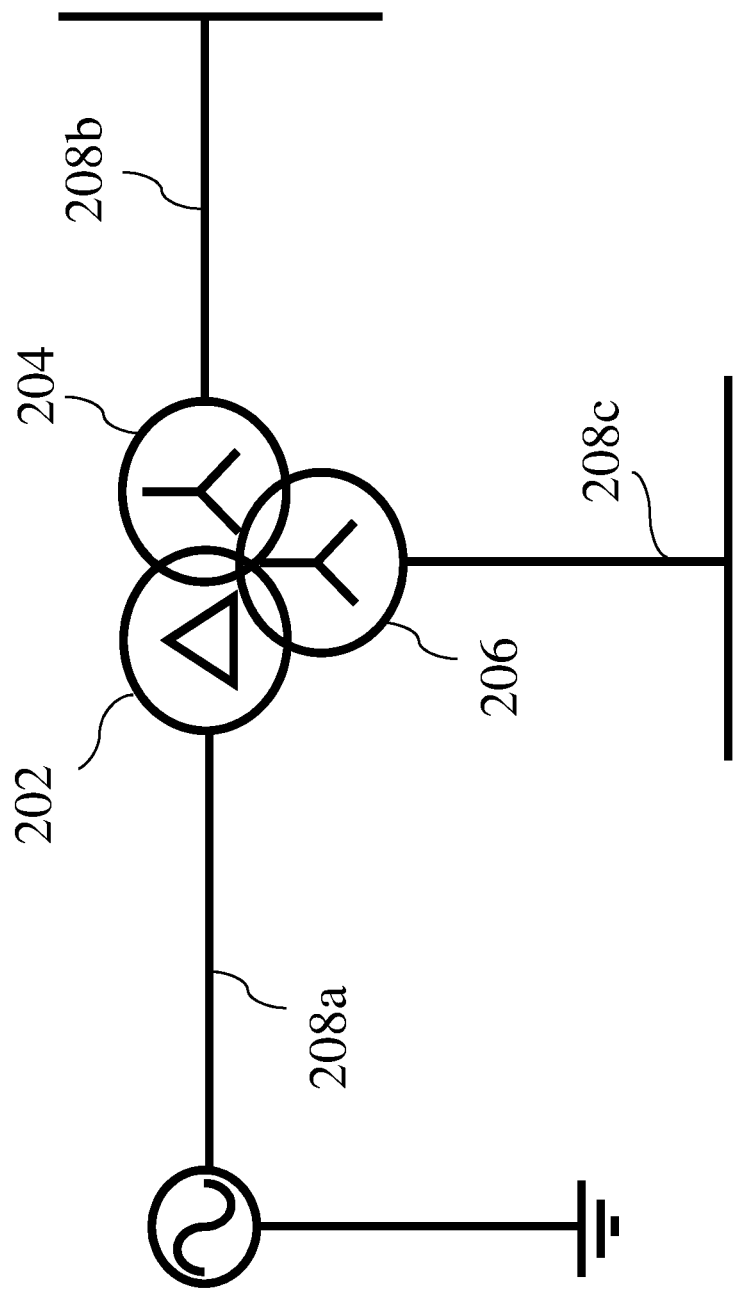
FIG. 2 shows a single line diagram of a power transformer connected in a power system, in accordance with another embodiment.

FIG. 2 shows the embodiment, wherein the power transformer has three windings—a first winding (202), a second winding (204) and a third winding (206). In accordance with the embodiment, the first winding is a delta connected winding, while the second and third windings are star connected windings. Also, as shown, the three windings are connected with three lines. Here, the first winding is connected with the first line (208*a*), the second winding is connected with the second line (208*b*), and the third winding is connected with the third line (208*c*).

Figure 3:
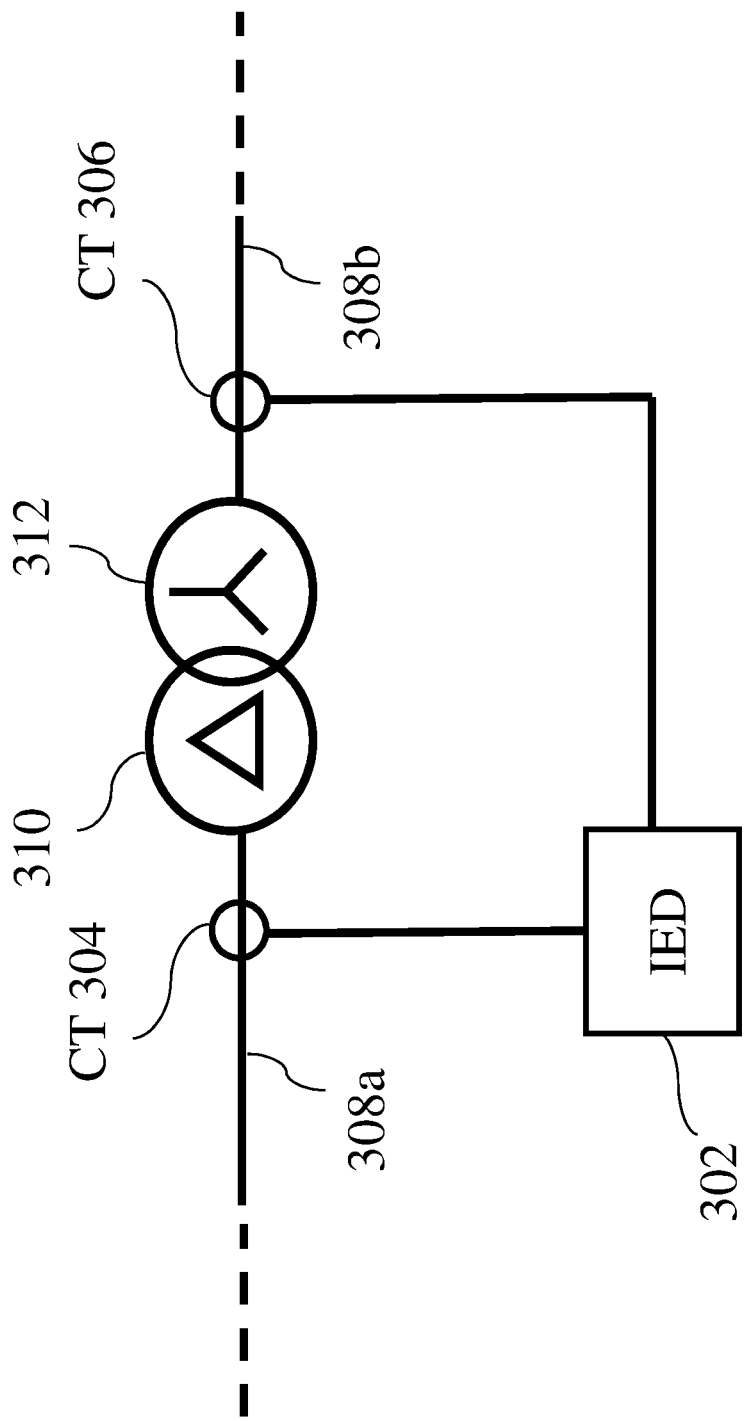
FIG. 3 shows a connection of an intelligent electronic device for obtaining line currents, in accordance with an embodiment.

The calculations of the winding currents can be performed with a device associated with the transformer. For example, the device can be an Intelligent Electronic Device (IED). An example is illustrated in FIG. 3, wherein the IED (302) is associated with the power transformer. The IED receives one or more signals from one or more measurement equipment connected to the line. For example, the measurement equipment can include a current transformer, a sensor-based measurement equipment (e.g. Rogowski coils, non-conventional instrument transformers etc.) and/or the like, which provides a signal corresponding to current, as sensed from the line. For example, a current transformer provides single/multiple phase current signal to the TED.

In an embodiment, the TED receives a signal(s) from the measurement equipment, and obtain measurements therefrom. In another embodiment, the measurement equipment publishes the measurements over a bus (e.g. process bus), and the TED (e.g. subscribed to receive data from such bus) receives the measurements.

In the embodiment of FIG. 3, current transformers are connected with the lines. As shown one CT (304) is connected on the line (308a) connected the first winding (310) and another CT (306) is connected on the line (308b) connected with the second winding (312). In this embodiment, the first winding is a delta connected winding and the second winding is a star conencted winding. It should be noted that CTs are connected to have measurements for each phase. As shown in FIG. 3, the IED receives the signals from the CTs connected with each line.

Thus, the IED has line currents measured at each line (connected with the corresponding windings of the transformer). The line currents measured are used for calculating the winding currents. In accordance with various embodiments, the device (e.g. such as IED 302) performs one or more functions for calculating the windings currents. Accordingly, the device has a plurality of modules.

Figure 4:
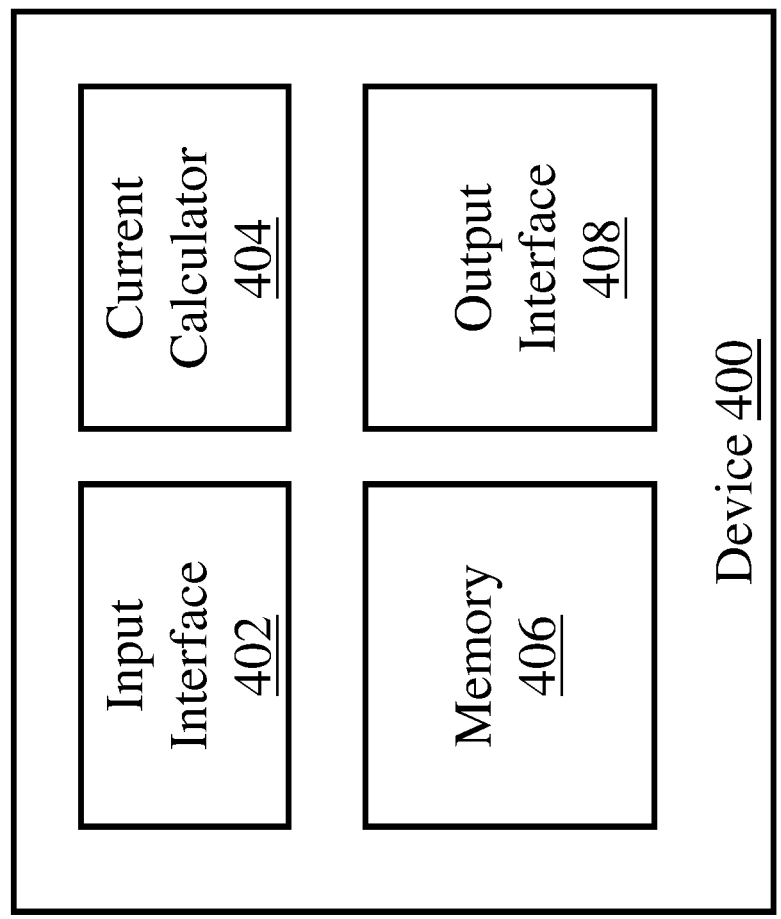
FIG. 4 is a block diagram of a device for calculating winding currents, in accordance with an embodiment.

FIG. 4 is a simplified block diagram of the device with the plurality of modules. Here, the plurality of modules include an input interface (402), a current calculator (404), a memory (406), and an output interface (408).

The input interface receives measurements of line currents. Consider that the device is the IED. In this case, the IED receives the measurements obtained from the measurement equipment connected at the lines. The input interface can also act as a communication interface for receiving information from other devices. For instance, the measurements may be published over the bus, and the IED subscribes to the same.

The current calculator performs various current calculations with the line currents measured with the measurement equipment. For example, the current calculation module can calculate zero sequence currents from measurements at a line. Such quantities (e.g. phasors) may be obtained using a suitable phasor calculation such as, but not limited to, Fourier calculations. In accordance with an embodiment, the current calculations include calculation of zero sequence currents for each winding, and calculation of the winding currents for the first winding (i.e. delta connected winding). The current calculations that can be performed by the current calculator are detailed in conjunction with descritpion of FIG. 6 below.

The memory can be any suitable storage for storing different information such as, but not limited to, disturbance records, line parameters etc. The memory can have information required for performing one or more functions (e.g. the current calculations). For example, phase displacement between the windings, turns ratios etc. may be stored in the memory. Such information can be stored in the device beforehand (e.g. by operating personnel).

The output interface renders the winding currents values for one or more of monitoring, protection and control operations associated with the transformer. For example, the device can have a display, and the values of winding currents can be shown on the display. Here, the rendering comprises generating a signal to display the winding current values on the display of the device.

The device may be connected with a switching device. For example, the switching device can be a circuit breaker. Accordingly, the device performs a protection function. Here, the rendering comprises generating a trip signal for operating the switching device associated with the transformer.

The plurality of modules of the device may be implemented using one or more processors. For instance, the modules may be implemented with a processor of an IED (e.g. IED 302). The winding current calculations may also be performed with communication between a device associated with the transformer and a server. Here, some of the modules may be implemented with the server (e.g. calculations or use of models using measurements from measurement equipment at various lines), while the others are performed with the device (e.g. input interface, output interface etc.). Alternately, the modules may be implemented at the server, and the values for winding currents that are calculated at the server communicated to the TED for display. Here, the measurements are available with the server to perform the different functions.

The following provides details of the winding current calculations that are performed by the device (or modules) as described hereinabove.

Figure 5:
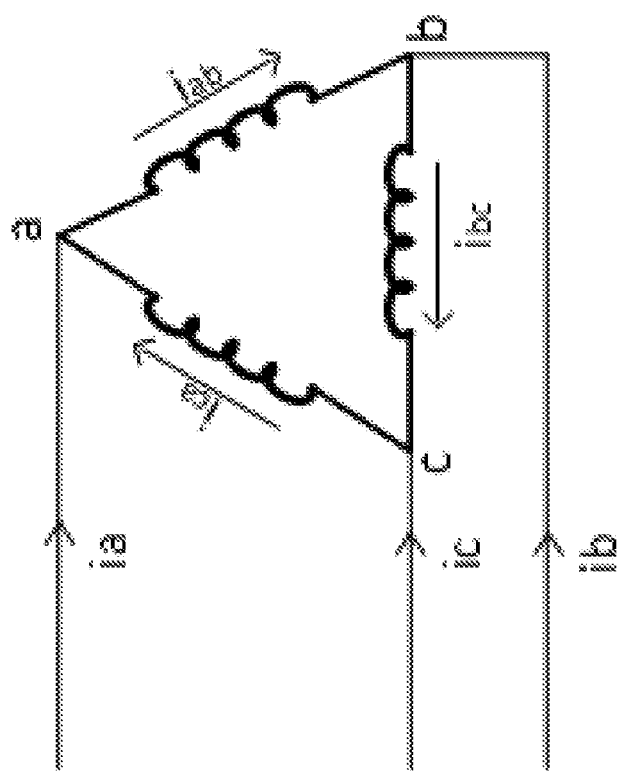
FIG. 5 shows a delta winding of a transformer, in accordance with an embodiment.

In a delta winding (such as 102, 202, 310 etc.), available instantaneous line currents measured using CTs can be denoted as $i_a$, $i_b$, and $i_c$. Further, unknown phase (winding) currents can be denoted as $i_{ca}$, $i_{ab}$, and $i_{bc}$ as shown in FIG. 5.

$$i_{ab} - i_{ca} = i_a \quad (1)$$

$$i_{bc} - i_{ab} = i_b \quad (2)$$

$$i_{ca} - i_{bc} = i_c \quad (3)$$

Thus, there are three equations and three unknowns, which can be solved by using the rank method as follows.

We start with Ax=B, where, $$A = \begin{pmatrix} 1 & 0 & -1 \\ -1 & 1 & 0 \\ 0 & -1 & 1 \end{pmatrix},$$

$$x = \begin{pmatrix} i_{ab} \\ i_{bc} \\ i_{ca} \end{pmatrix}, \text{ and}$$

$$B = \begin{pmatrix} i_a \\ i_b \\ i_c \end{pmatrix}.$$

Accordingly, we have the following relation:

$$\begin{pmatrix} 1 & 0 & -1 \\ -1 & 1 & 0 \\ 0 & -1 & 1 \end{pmatrix} \begin{pmatrix} i_{ab} \\ i_{bc} \\ i_{ca} \end{pmatrix} = \begin{pmatrix} i_a \\ i_b \\ i_c \end{pmatrix}$$

Thus, we can create an augmented matrix [AB] as follows:

$$\text{Augmented matrix } [AB] = \begin{pmatrix} 1 & 0 & -1 & i_a \\ -1 & 1 & 0 & i_b \\ 0 & -1 & 1 & i_c \end{pmatrix}$$

We can add rows (R1, R2) to get the following relation:

$$R3 \rightarrow R1 + R2 = \begin{pmatrix} 1 & 0 & -1 & i_a \\ 0 & 1 & -1 & i_a + i_b \\ 0 & -1 & 1 & i_c \end{pmatrix}$$

Similarly, we can add rows (R2, R3) of above matrix to get the following relation:

$$R4 \rightarrow R2 + R3 = \begin{pmatrix} 1 & 0 & -1 & i_a \\ 0 & 1 & -1 & i_a + i_b \\ 0 & 0 & 0 & i_a + i_b + i_c \end{pmatrix}$$

In a delta configuration, the circuit does not allow ground currents (i.e. zero sequence currents) into the line currents. Accordingly, $i_a+i_b+i_c=0$.

Thus, the last row in the above matrix can be updated as follows:

$$R4 \rightarrow R2 + R3 = \begin{pmatrix} 1 & 0 & -1 & i_a \\ 0 & 1 & -1 & i_a + i_b \\ 0 & 0 & 0 & 0 \end{pmatrix}$$

The rank of the updated matrix (Rank of A=Rank of [AB])=2=<n (number of variables). This will have infinite number of solutions, and cannot be solved.

The zero sequence currents for a delta winding can be estimated from line currents at the other winding. The line currents at the other windings (star connected), can be used to determine the zero sequence currents for the star connected winding. The zero sequence currents for the delta winding can be calculated with the zero sequence current for the star connected winding(s), using the phase displacement and turns ratio (as the current transformation in the windings depends on the phase displacement and turns ratio) of the windings.

For a delta winding, we can sum the winding currents as, $i_{ca}+i_{ab}+i_{bc}=3i_0=3k$     (4)

In the above, $i_{ca}$, $i_{ab}$ and $i_{bc}$ are the winding currents and $i_0$ is the circulating current. Now, there are four equations and three unknowns (equations 1 to 4 as mentioned above). Accordingly, we can get a solution for any three equations, and if it satisfies the fourth equation also, then it can be the solution for the above system of equations.

So, we can start by taking three equations like equations 1, 2 and 4:

$i_{ab}-i_{ca}==i_a$     (1)

$i_{bc}-i_{ab}==i_b$     (2)

$i_{ca}-i_{ab}+i_{bc}=3k$     (4)

After solving the above equations using rank method, we arrive at:

$i_{ab}=(i_a-i_b)/3+k$     (i)

$i_{bc}=(i_a+2i_b)/3+k$     (ii)

$i_{ca}=(-2i_a-i_b)/3+k$     (iii)

This solution is satisfying the equation 3 (i.e. $i_{ca}-i_{bc}=i_c$) also. Accordingly, it can be considered as a solution for the system of equations. If we take any three equations including equation (4) and solve, the same solution will come.

As $i_a+i_b+i_c=0$ (always), we can rearrange the equations like:

$$i_{ab} = \frac{ia - ib}{3} + k$$

$$i_{bc} = \frac{ib - ic}{3} + k$$

$$i_{ca} = \frac{ic - ia}{3} + k$$

The 'k' denotes the zero sequence currents which will be circulating in the delta winding and they cannot be estimated from line currents measured at the line connected with the delta winding. This is because the line currents of the delta winding are free from the zero sequence currents for any system condition. Accordingly, if 'k' or the zero sequence currents circulating in the delta winding can be calculated, we can calculate the winding currents for the delta side.

The following describes the calculation of the zero sequence currents, and accordingly the winding currents for the delta side.

Figure 6:
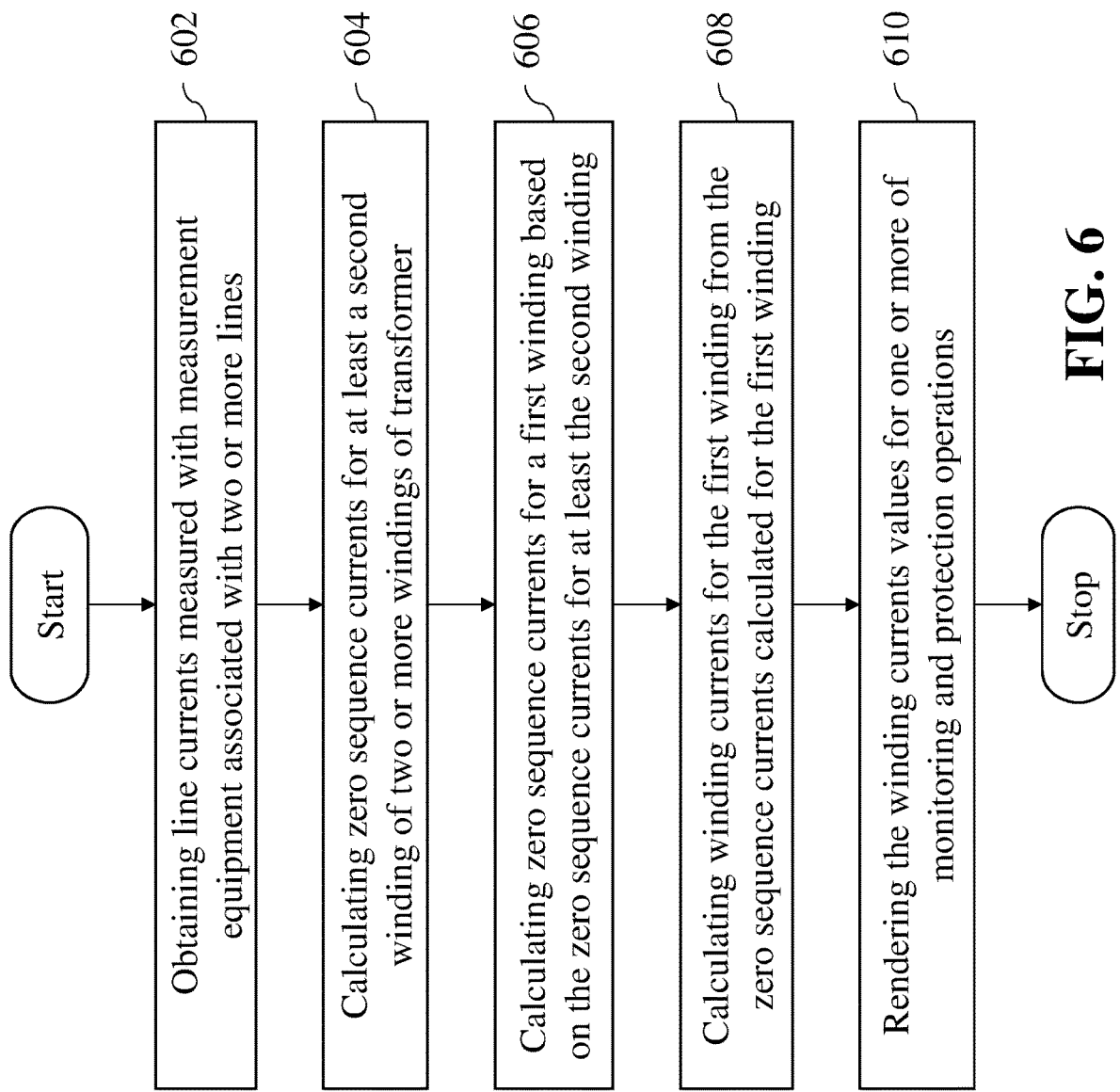
FIG. 6 is a flowchart of a method for calculating winding currents, in accordance with an embodiment.

Referring to FIG. 6, which shows a flowchart of the method for calculating winding currents, in accordance with one embodiment of the present disclosure.

At 602, the line currents measured by CTs towards the windings are obtained. For example, the line currents measured with CTs (such as 304, 306) are obtained by the IED 302 (or device 400). It is assumed that the transformer vector connections are made according to standard connections.

Figure 7:
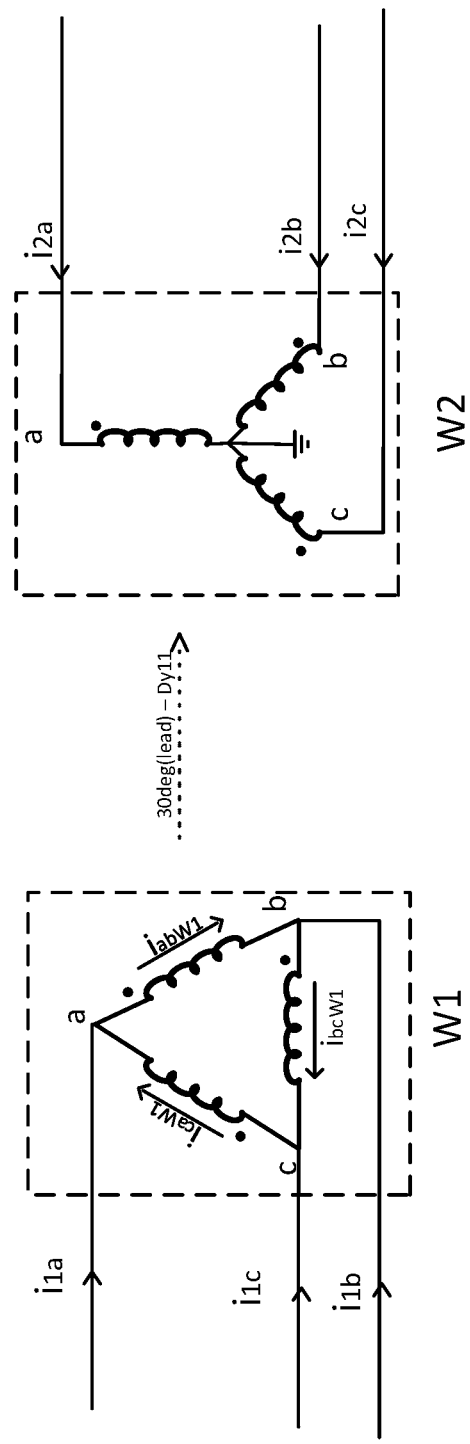
FIG. 7 shows two windings of a transformer, in accordance with an embodiment.

Consider a two winding transformer (such as 100). The transformer can have two windings (such as 102, 104). Referring to FIG. 7, the two windings are denoted as W1 (winding 1) and W2 (winding 2). In FIG. 7, the first winding (W1) is connected as "Delta", and the second winding (W2) is connected as "WYE". The line currents at the first winding (W1) are $i_{1a}$, $i_{1b}$, and $i_{1c}$. These are measured with the CTs connected at the corresponding line (or phases). Similarly, the line currents at the second winding are $i_{2a}$, $i_{2b}$, and $i_{2c}$.

At 604, the zero sequence currents for at least the second winding of the two or more windings of the transformer are calculated. The zero sequence currents for at least the second winding are calculated from the line currents measured at a corresponding line connected with at least the second winding. Considering the embodiment of FIG. 7, the zero sequence currents ($i_{0W2}$) for the second winding (W2) is calculated with the line currents. For example, the zero sequence currents can be calculated as follows:

$$i_{0W2} = \frac{i_{2a} + i_{2b} + i_{2c}}{3}.$$

At 606, the zero sequence currents for the first winding are calculated. The zero sequence currents for the first winding are calculated based on the zero sequence currents calculated for at least the second winding, a phase displacement between the two or more windings, and a turns ratio associated with the two or more windings of the transformer.

Considering the embodiment of FIG. 7, the zero sequence currents ($i_{0W1}$) for the first winding (W1), i.e. the delta connected winding, are calculated using the zero sequence currents ($i_{0W2}$) calculated for the second winding (W2). For example, the zero sequence currents ($i_{0W1}$) for the first winding (W1) can be calculated as follows:

$$i_{0W1} = \frac{Z_{f2} * i_{0W2}}{turnRatioW12}.$$

In the above equation, $Z_{f2}$ is +1 when phase displacement between W1 and W2 is 0 degree or 30 degree lag to 150 degree lag, $Z_{f2}$ is −1 when phase displacement between W1 and W2 is 30 degree lead to 150 degree lead or 180 degree, and turnRatioW12 (i.e. turns ratio) is the voltage ratio between winding 1 and winding 2.

The winding currents for the delta connected winding are calculated at 608, from the zero sequence currents calculated for the first winding, and the line currents measured at a corresponding line connected with the first winding. Referring again to the embodiment of FIG. 7, the winding currents ($i_{abW1}$, $i_{bcW1}$, $i_{caW1}$) can be calculated as follows (refer description above in association with FIG. 5):

$$i_{abW1} = \left(\frac{i_{1a} - i_{1b}}{3}\right) + i_{0W1}$$
$$i_{bcW1} = \left(\frac{i_{1b} - i_{1c}}{3}\right) + i_{0W1}$$
$$i_{caW1} = \left(\frac{i_{1c} - i_{1a}}{3}\right) + i_{0W1}$$

Once the winding current values are calculated, the values can be rendered at 610, for different operations. These can include one or more of, but not limited to, monitoring operations, and protection operations associated with the transformer. For example, the winding current values may be displayed for monitoring purposes. Here, the rendering can include generating a signal for displaying the winding current values on the display. Taking another example, the winding currents may be monitored (e.g. along with the line currents) for protection of the transformer. This may involve generating a trip signal(s) based on the monitoring.

The method described in conjunction with FIG. 6, can be performed with the device as described above (refer description of FIGS. 1-4 above). Accordingly, the method may be performed by an IED (such as 302), or device (400), or other power system device. The method may also be performed with a server associated with the power system. Here, the server receives the line currents and has the transformer details (i.e. winding configurations, phase displacements, turns ratios etc.). The server can calculate the winding currents and the same may be communicated (e.g. server sends the values to a power system device associated with the transformer).

The method described in conjunction with FIG. 6, refers to an embodiment shown in FIG. 7, where the transformer has two windings, with W1 as a delta connected winding, and W2 as a wye connected winding. The presently disclosed methods and devices can be used for different transformer configurations, and various examples are provided herein below.

Consider if W1 (winding 1) is connected in a wye configuration, and W2 is connected in a delta configuration. Accordingly, the zero sequence currents for the wye connected winding can be calculated as follows:

$$i_{0W1} = \frac{i_{1a} + i_{1b} + i_{1c}}{3}.$$

In the above, $i_{0W1}$ is the zero sequence currents for the wye connected winding, and $i_{1a}$, $i_{1b}$, and $i_{1c}$ are the line currents measured for the line connected with the wye connected winding. The zero sequence currents for the delta connected winding ($i_{0W2}$) can be calculated as follows for this configuration:

$$i_{0W2} = \frac{i_{0W1} * turnRatioW12}{Z_{f2}}$$

In the above, $Z_{f2}$=−1 when phase displacement between W1 and W2 is 0 deg or 30° deg lag to 150 deg lag, $Z_{f2}$=+1 when phase displacement between W1 and W2 is 30 deg lead to 150 deg lead or 180 deg, and turnRatioW12=Voltage ratio between winding 1 and winding 2.

Accordingly, the winding currents for the delta side can be calculated as follows:

$$i_{abW2} = \left(\frac{i_{2a} - i_{2b}}{3}\right) + i_{0W2}$$
$$i_{bcW2} = \left(\frac{i_{2b} - i_{2c}}{3}\right) + i_{0W2}$$
$$i_{caW2} = \left(\frac{i_{2c} - i_{2a}}{3}\right) + i_{0W2}$$

In the above, $i_{abW2}$, $i_{bcW2}$ and $i_{caW2}$ are the winding currents, and $i_{2a}$, $i_{2b}$, and $i_{2c}$ are the line currents measured for the line connected with the delta winding.

Suppose there is a three winding transformer, where the winding 1 (W1) is connected as "Delta", the winding 2 (W2) and winding 3 (W3) are connected as "WYE". In this configuration, the zero sequence currents are calculated for the second and third windings are calculated as follows:

$$i_{0W2} = \frac{i_{2a} + i_{2b} + i_{2c}}{3}$$
$$i_{0W3} = \frac{i_{3a} + i_{3b} + i_{3c}}{3}$$

In the above, $i_{0W2}$ and $i_{0W3}$ are the zero sequence winding currents for W2 and W3. Further $i_{2a}$, $i_{2b}$ and $i_{2c}$, and $i_{3a}$, $i_{3b}$, and $i_{3c}$ are the line currents measured for the lines connected with the two windings. Here, the zero sequence currents for W1 (i.e. the delta connected winding) can be calculated as follows:

$$i_{0W1} = \frac{Z_{f2} * i_{0W2}}{turnsRatioW12} + \frac{Z_{f3} * i_{0W3}}{turnsRatioW13}.$$

In the above, $i_{0W1}$=the zero sequence currents for the first winding, $Z_{f2}$=+1 when phase displacement between W1 and W2 is 0 deg or 30° deg lag to 150 deg lag.

$Z_{f2}$=−1 when phase displacement between W1 and W2 is 30 deg lead to 150 deg lead or 180 deg $Z_{f3}$=+1 when phase displacement between W1 and W3 is 0 deg or 30° deg lag to 150 deg lag.

$Z_{f3}$=−1 when phase displacement between W1 and W3 is 30 deg lead to 150 deg lead or 180 deg turnRatioW12=Voltage ratio between winding 1 and winding 2 turnRatioW13=Voltage ratio between winding 1 and winding 3

Accordingly, the winding currents for the delta winding can be calculated as follows:

$$i_{abW1} = \left(\frac{i_{1a} - i_{1b}}{3}\right) + i_{0W1}$$

$$i_{bcW1} = \left(\frac{i_{1b} - i_{1c}}{3}\right) + i_{0W1}$$

$$i_{caW1} = \left(\frac{i_{1c} - i_{1a}}{3}\right) + i_{0W1}$$

In the above, $i_{abW1}$, $i_{bcW1}$, and $i_{caW1}$ are the winding currents, and $i_{1a}$, $i_{1b}$, and $i_{1c}$ are the line currents measured for the line connected with the delta winding.

Consider another transformer configuration, wherein the winding 2 (W2) is connected as "Delta", and winding 1 (W1) and winding 3 (W3) are connected as "WYE". Here, the zero sequence currents for W1 and W3 ($i_{0W1}$, $i_{0W3}$) can be calculated as below:

$$i_{0W1} = \frac{i_{1a} + i_{1b} + i_{1c}}{3}$$

$$i_{0W3} = \frac{i_{3a} + i_{3b} + i_{3c}}{3}.$$

Here $i_{1a}$, $i_{1b}$, $i_{1c}$ and $i_{3a}$, $i_{3b}$, $i_{3c}$ are the measured line currents for the two windings. The zero sequence currents ($i_{0W2}$) for the delta connected winding can be calculated as below:

$$i_{0W2} = \frac{turnsRatioW12 * i_{0W1}}{Z_{f2}} - \frac{turnsRatioW12 * Z_{f3} * i_{0W3}}{Zf2 * turnsRatioW13}.$$

In the above, $Z_{f2}$=−1 when phase displacement between W1 and W2 is 0 deg or 30° deg lag to 150 deg lag, $Z_{f2}$=+1 when phase displacement between W1 and W2 is 30 deg lead to 150 deg lead or 180 deg, $Z_{f3}$=−1 when phase displacement between W1 and W3 is 0 deg to 30° deg lag to 150 deg lag, $Z_{f3}$=+1 when phase displacement between W1 and W3 is 30 deg lead to 150 deg lead or 180 deg, turnRatioW12=Voltage ratio between winding 1 and winding 2, and turnRatioW13=Voltage ratio between winding 1 and winding 3.

Therefore, the winding currents for the delta connected windings can be calculated as follows, $$i_{abW2} = \left(\frac{i_{2a} - i_{2b}}{3}\right) + i_{0W2}$$

$$i_{bcW2} = \left(\frac{i_{2b} - i_{2c}}{3}\right) + i_{0W2}$$

$$i_{caW2} = \left(\frac{i_{2c} - i_{2a}}{3}\right) + i_{0W2}$$

Here $i_{abW2}$, $i_{bcW2}$, and $i_{caW2}$ are the winding currents, and $i_{2a}$, $i_{2b}$, and $i_{2c}$ are the line currents measured for the line connected with the delta connected winding.

Similarly, in a configuration where the windings 1 and 2 are connected as "WYE" and the third winding is connected as "Delta", the zero sequence currents can be calculated for the two windings connected as wye as follows:

$$i_{0W1} = \frac{i_{1a} + i_{1b} + i_{1c}}{3}$$

$$i_{0W2} = \frac{i_{2a} + i_{2b} + i_{2c}}{3}$$

In the above, $i_{0W1}$ and $i_{0W2}$ are the winding currents. Further $i_{1a}$, $i_{1b}$, $i_{1c}$ and $i_{2a}$, $i_{2b}$, $i_{2c}$ are the measured line currents for the winding 1 and winding 2. The zero sequence currents ($i_{0W3}$) for the delta connected winding (winding 3 in this configuration) can be calculated as follows:

$$i_{0W3} = \frac{turnsRatioW13 * i_{0W1}}{Z_{f3}} - \frac{turnsRatioW13 * Z_{f2} * i_{0W2}}{Z_{f3} * turnsRatioW12}$$

In the above, $Z_{f2}$=−1 when phase displacement between W1 and W2 is 0 deg or 30° deg lag to 150 deg lag, $Z_{f2}$=+1 when phase displacement between W1 and W2 is 30 deg lead to 150 deg lead or 180 deg, $Z_{f3}$=−1 when phase displacement between W1 and W3 is 0 deg or 30° deg lag to 150 deg lag, $Z_p$=+1 when phase displacement between W1 and W3 is selected as 30 deg lead to 150 deg lead or 180 deg, turnRatioW12=Voltage ratio between winding 1 and winding 2, and turnRatioW13=Voltage ratio between winding 1 and winding 3.

Therefore the winding currents can be calculated as follows, $$i_{abW3} = \left(\frac{i_{3a} - i_{3b}}{3}\right) + i_{0W3}$$

$$i_{bcW3} = \left(\frac{i_{3b} - i_{3c}}{3}\right) + i_{0W3}$$

$$i_{caW3} = \left(\frac{i_{3c} - i_{3a}}{3}\right) + i_{0W3}$$

In the above, $i_{abW3}$, $i_{bcW3}$, and $i_{caW3}$ are the winding currents, and $i_{3a}$, $i_{3b}$, and $i_{3c}$ are the line currents measured for the line connected with the delta connected winding.

The above calculations are valid for any configuration of the windings, wherein any of the first and second (and third winding as the case be) may be the primary, secondary, and tertiary winding.

The method of the present disclosure calculates the winding currents (at a delta side) for a delta connected transformer from line currents measured at a delta winding, line currents measured at other winding(s), transformer configuration (star or delta), phase displacement between windings (1'0 clock or 11'0 clock etc. . . . ), and turns ratio between the windings. Clock numbers can be related to degrees (i.e. phase displacement).

The method can be used for finding the winding currents with circulation currents. The winding currents calculated by this method help to estimate the effects of through faults (or other winding health/energy calculations) on different types of transformer configuration, using only line currents and less computational effort (as only few parameters are required). The fault may be any external fault or external load change causing unbalance in the system, which results in zero sequence current flowing through the transformer.

The invention claimed is:

1. A method for calculating winding currents at a delta side for a transformer comprising two or more windings connected with two or more lines, with at least a first winding of the two or more windings being a delta connected winding, the method being performed with a device associated with the transformer, the method comprising:
obtaining line currents measured with measurement equipment associated with the two or more lines;
calculating zero sequence currents for at least a second winding of the two or more windings of the transformer, from the line currents measured at a corresponding line connected with at least the second winding;
calculating zero sequence currents for the first winding based on (i) the zero sequence currents calculated for at least the second winding, (ii) a phase displacement between the two or more windings, and (iii) a turns ratio associated with the two or more windings of the transformer;
calculating winding currents for the first winding from the zero sequence currents calculated for the first winding and from the line currents measured at a corresponding line connected with the first winding; and
rendering the calculated winding currents for one or more monitoring, protection, and control operations associated with the transformer.

2. The method of claim 1, wherein the transformer has three windings comprising the first winding, the second winding, and a third winding, and wherein the zero sequence currents for the first winding are calculated based on (i) the zero sequence currents calculated for the second and third windings, (ii) the phase displacement between the first and second windings, (iii) the phase displacement between the first and third windings, (iv) the turns ratio between the first and second windings, and (v) the turns ratio between the first and third windings.

3. The method of claim 1, wherein the transformer has two windings consisting of the first and second windings, and wherein the zero sequence currents for the first winding are calculated based on (i) the zero sequence currents calculated for the second winding, (ii) the phase displacement between the first and second windings, and (iii) the turns ratio between the first and second windings.

4. The method of claim 1, wherein the second winding is a star connected winding.

5. The method of claim 1, wherein the transformer has three windings comprising the first winding, the second winding and a third winding, and wherein each of the second and third windings is one of a star connected winding and a wye connected winding.

6. The method of claim 1, wherein rendering the calculated winding currents for one or more monitoring, protection, and control operations comprises displaying the calculated winding currents on an interface associated with the device.

7. The method of claim 1, wherein rendering the calculated winding currents for one or more monitoring, protection, and control operations comprises generating a trip signal based on the calculated winding currents.

8. The method of claim 1, wherein rendering the calculated winding currents for one or more monitoring, protection, and control operations comprises calculating a health index associated with the first winding based on the calculated winding currents.

9. A device for calculating winding currents at a delta side for a transformer comprising two or more windings connected with two or more lines, with at least a first winding of the two or more windings being a delta connected winding, the device comprising:
an input interface configured to obtain line currents measured with measurement equipment associated with the two or more lines;
a current calculator configured to:
calculate zero sequence currents for at least a second winding of the two or more windings of the transformer, from the line currents measured at a corresponding line connected with at least the second winding;
calculate zero sequence currents for the first winding based on (i) the zero sequence currents calculated for at least the second winding, (ii) a phase displacement between the two or more windings, and (iii) a turns ratio associated with the two or more windings of the transformer; and
calculate winding currents for the first winding from the zero sequence currents calculated for the first winding and from the line currents measured at a corresponding line connected with the first winding; and
an output interface configured to render the calculated winding currents for one or more monitoring, protection, and control operations associated with the transformer.

10. The device of claim 9, wherein the output interface is a display configured to display the calculated winding current values.

11. The device of claim 9, wherein the output interface is configured to generate a trip signal for operating a switching device associated with the transformer.

12. The device of claim 9, wherein the transformer has three windings comprising the first winding, the second winding, and a third winding, and wherein the current calculator is configured to calculate the zero sequence currents for the first winding based on (i) the zero sequence currents calculated for the second and third windings, (ii) the phase displacement between the first and second windings, (iii) the phase displacement between the first and third windings, (iv) the turns ratio between the first and second windings, and (v) the turns ratio between the first and third windings.

13. The device of claim 9, wherein the transformer has two windings consisting of the first and second windings, and wherein the current calculator is configured to calculate the zero sequence currents for the first winding based on (i)

the zero sequence currents calculated for the second winding, (ii) the phase displacement between the first and second windings, and (iii) the turns ratio between the first and second windings.

14. The device of claim 9, wherein the second winding is a star connected winding.

15. The device of claim 9, wherein the transformer has three windings comprising the first winding, the second winding and a third winding, and wherein each of the second and third windings is one of a star connected winding and a wye connected winding.

* * * * *